INVENTOR.
LAWRENCE P. WENNIK
BY John V. Regan
Attorney

United States Patent Office 3,290,520

Patented Dec. 6, 1966

3,290,520

CIRCUIT FOR DETECTING AMPLITUDE THRESHOLD WITH MEANS TO KEEP THRESHOLD CONSTANT

Lawrence P. Wennik, Philadelphia, Pa., assignor to Radio Corporation of America, a corporation of Delaware Filed Jan. 26, 1965, Ser. No. 428,058

5 Claims. (Cl. 307—88.5)

This invention relates to electronic data processing equipment, and more particularly to sense amplifier circuits.

One type of sense amplifier circuit is required to discriminate between two signal levels representative of binary information by substantially rejecting one signal level while amplifying the other signal level. The signal levels to be discriminated are ordinarily applied by way of a first stage preamplifier to a second stage amplifier having a predetermined threshold which is selected so that only one of the two signal levels appears at the circuit output.

A primary requirement of the threshold amplifying circuit is that its threshold be maintained relatively independent of temperature and supply voltage variations so that the two signal levels can be sensed unambiguously over the entire operating range of the equipment. A disadvantage of many prior art circuits is that their thresholds are somewhat sensitive to temperature and supply voltage variations and hence have a restricted operating range and may require a complex supply source. This is particularly true where certain semiconductor components are used in the sense amplifier circuit.

It is a principal object of this invention to provide an improved semiconductor amplifier circuit having a threshold which is relatively independent of temperature and supply voltage variations.

In accordance with an embodiment of this invention there is provided a threshold amplifier circuit in which the first stage is a differential amplifier having first and second inputs, first and second outputs and first and second power terminals. A current source is coupled between the second power terminal and one terminal of the supply voltage. The other terminal of the supply voltage is coupled to the first power terminal.

The second stage of the sense amplifier circuit includes first and second transistors. The collectors of the second stage transistors are coupled to an output means and through a resistor to the first power terminal. The first and second differential amplifier outputs are coupled to the bases of the first and second transistors, respectively. The emitters of the transistors are coupled in common to a semiconductor control means for setting the voltage level of the emitters. Moreover, the semiconductor of control means modifies this voltage level to compensate for supply voltage and temperature variations, thereby maintaining the threshold of the second stage relatively independent of such variations. The semiconductor control means is a third transistor having its emitter coupled to the emitters of the first and second transistors and through a resistor to the supply voltage. The base of the level control transistor is coupled between the terminals of the supply voltage by a voltage divider arrangement. The second stage and control transistors are fabricated on a monolithic piece of semiconductor material so that a change in temperature produces like effects in each transistor.

Figure 1:
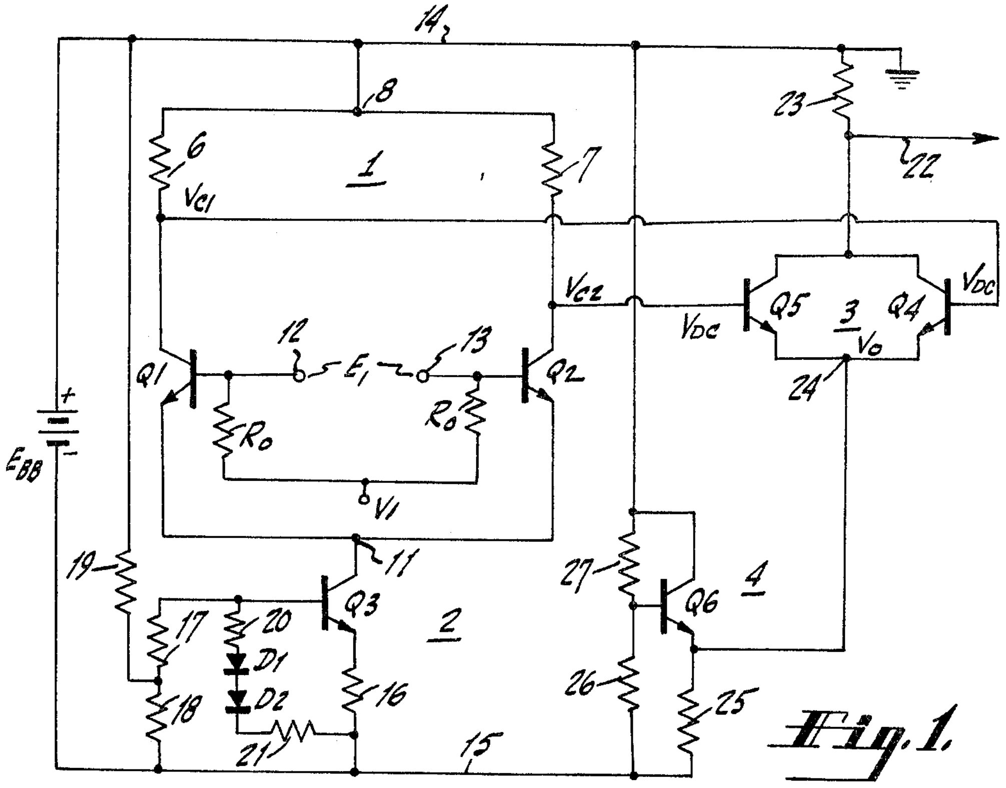
Figure 2:
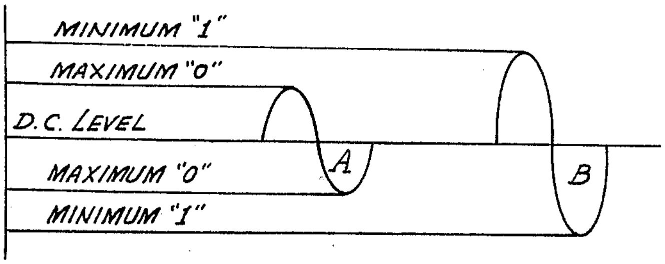

FIG. 1 is a circuit diagram of a sense amplifier arrangement according to the invention; and FIG. 2 is a voltage versus time diagram of the two types of input signal applied to the sense amplifier.

In FIG. 1 the first stage of the sense amplifier is illustrated as a transistor differential amplifier 1 having a current source 2. The second stage of the sense amplifier is illustrated as an amplifier 3 having a threshold which is controlled by semiconductor means 4.

In the differential amplifier stage, transistors Q1 and Q2 have their collectors connected by way of resistors 6 and 7 to a first power terminal 8 and their emitters connected to a second power terminal 11. The power terminal 8 is connected to a first circuit junction 14. The bases of transistors Q1 and Q2 are connected by way of resistors $R_0$ to a bias source V1. Input signals $E_1$ are applied to the bases of transistors Q1 and Q2 by way of input terminals 12 and 13, respectively.

Constant current source 2 is illustrated as a transistor Q3 having its collector connected to the second power terminal 11 of the differential amplifier. The emitter of transistor Q3 is connected to a second circuit junction 15 by way of a resistor 16. The base of transistor Q3 is connected between the first and second circuit junctions 14 and 15 by means of a voltage divider arrangement illustrated as resistors 17, 18 and 19. A supply voltage $E_{BB}$ is illustrated as having its positive terminal connected to the first power terminal 8 at first circuit junction 14 and its negative terminal connected to the second circuit junction 15. The series connection of resistor 20, diodes D1 and D2 and resistor 21 between the base of transistor Q3 and second circuit junction 15 provides temperature compensation for transistor Q3. Diodes D1 and D2 preferably are integrated in the same piece of semiconductor material as transistor Q3. Since this temperature compensation network is not part of the present invention, no further description is necessary. However, reference is made to U.S. Patent No. 2,951,208 issued to L. E. Barton for a detailed description of the operation of the temperature compensation network.

In the second stage amplifier 3 transistors Q4 and Q5 have their collectors connected in common to an output connection 22. The collectors of transistors Q4 and Q5 are also connected by way of a resistor 23 to the first circuit junction 14. The emitters of transistors Q4 and Q5 are connected in common to a third circuit junction 24. The bases of transistors Q4 and Q5 are connected to the outputs $V_{c1}$ and $V_{c2}$ of the differential amplifier, respectively.

In the level control circuit 4 transistor Q6 has its collector connected to the first circuit junction 14 and its emitter connected to the third circuit junction 24. The emitter of transistor Q6 is also connected to the second circuit junction 15 by way of a resistor 25. The base of transistor Q6 is connected between the first and second circuit junctions 14 and 15 by means of a voltage divider arrangement illustrated as resistors 26 and 27.

FIG. 2 is a waveform of typical input signals of the differential mode type signals and illustrated as input A or B indicative of binary information. The magnitudes of signals A and B may be arbitrarily considered indicative of a binary zero and one, respectively. The magnitude of signal B is considered to be the minimum value which is representative of a binary one; while the magnitude of signal A is considered to be the maximum value which is representative of a binary zero.

In operation consider that the values of the supply voltage $E_{BB}$ and resistors 16, 17, 18, 19, 20 and 21 are selected such that transistor Q3 is conducting to supply a constant current to the second power terminal 11 of the differential amplifier. Consider also that in the quiescent condition the bias V1 is of a value to forward bias the base-emitter junctions of transistors Q1 and Q2. In addition, consider that the common mode rejection of the differential amplifier is very high so that it responds only to signals in the differential mode, that is, input 12 goes more positive as input 13 goes more negative, and vice versa. The first circuit junction 14 may be arbitrarily regarded as the ground reference indicated in FIG. 1 by the conventional ground symbol.

With transistors Q1 and Q2 conducting, a D.C. voltage $V_{DC}$ is established at the differential amplifier outputs $V_{c1}$ and $V_{c2}$ and at the bases of transistors Q4 and Q5, assuming that resistors 6 and 7 are equal. The emitters of transistors Q4 and Q5 and junction 24 are at a voltage level $V_0$ determined by level control circuit 4. The values of resistors 26 and 27 are selected so that resistor 26 is large relative to resistor 27. The base-emitter junction of transistor Q6 is forward biased so that the transistor conducts to hold circuit junction 24 and the emitters of transistors Q4 and Q5 at voltage level $V_0$ determined by the values of resistors 26 and 27.

The relative values of $V_{DC}$ and $V_0$ set the threshold of the amplifier circuit 3, that is, the level of input voltage which is needed to produce a predetermined change in voltage level at the output. The criteria for setting this threshold are (1) that the predetermined change in voltage level at the output occurs only in response to input signals having a magnitude equal to a greater than the minimum magnitude of the B signal in FIG 2, and (2) that the predetermined amount of voltage level change at the output is compatible with the output circuitry so that the output circuitry is responsive to the predetermined change in voltage level. This threshold may be set by the amount of current supplied by the constant current source 3 and by the values of resistors 6, 7, 26 and 27. Whether or not $V_{DC}$ is more positive, or more negative than, or equal to, $V_0$ is a matter of choice depending on what is predetermined as the desired magnitude of voltage level change at the output 22 in response to input signals of the B type.

Assuming that $V_{DC}$ is equal to or more negative than $V_0$, both transistors Q4 and Q5 are cut off in the quiescent condition. If an input signal of the B type is applied to inputs 12 and 13 so that input 12 goes in a positive direction while input 13 goes in a negative direction, the output $V_{c1}$ applied to the base of transistor Q4 goes more negative while the output $V_{c2}$ applied to the base of transistor Q5 goes more positive. Transistor Q4 remains cut off. The base-emitter junction of transistor Q5 is forward biased so that transistor Q5 conducts, changing the voltage level of output 22 from near ground potential to a predetermined negative voltage level to which the output circuitry is responsive. If the input signal applied at inputs 12 and 13 is of the A type, the threshold presented by transistors Q4 and Q5 is not exceeded so that neither transistor conducts sufficiently to produce the predetermined output change.

For the condition where $V_{DC}$ is sufficiently more positive than $V_0$ so that the base-emitter junctions of transistors Q4 and Q5 are forward biased, both transistors conduct establishing a first voltage level at output 22. If an input signal of the A type is applied to inputs 12 and 13, there is no substantial change in voltage level at output 22. Although the base of one of the transistors Q4 or Q5 goes negative while the other goes positive, it does not go more negative than $V_0$. Consequently, the outputs of the two transistors cancel one another at the output junction 22. If an input signal of the B type is applied at inputs 12 and 13 so that input 12 goes positive as input 13 goes negative, the bases of transistors Q4 and Q5 go more negative and positive respectively. As the base of transistor Q4 becomes more negative than $V_0$, transistor Q4 cuts off. Transistor Q5 continues to conduct; and the output 22 changes from the first voltage level to a predetermined second voltage level to which the output circuitry is responsive.

It is apparent that it is important to maintain the threshold of the amplifier circuit relatively independent of variations in supply voltage $V_{BB}$ and independent of variations in temperature. If the supply voltage $E_{BB}$ should fluctuate in value, the D.C. voltage $V_{DC}$ generated at outputs $V_{c1}$ and $V_{c2}$ and applied to the bases of transistors Q4 and Q5 would also fluctuate causing the threshold to vary. On the other hand, if the temperature should vary, the voltage drop $V_{BE}$ across the base-emitter junctions of transistors Q4 and Q5 would also vary causing the threshold to drift.

How threshold drift due to supply voltage variation is minimized is described first. If supply voltage $E_{BB}$ varies in a negative direction, the current source transistor Q3 supplies more current to second power terminal 11. The larger currents flowing through transistors Q1 and Q2 result in larger voltage drops across resistors 6 and 7 driving outputs $V_{c1}$ and $V_{c2}$ more negative. Consequently, the bases of transistors Q4 and Q5 also go more negative.

This change in the base voltage of transistors Q4 and Q5 due to supply voltage variation is offset by level control circuit 4. The base-emitter junction of transistor Q6 is forward biased so that the transistor conducts. When supply voltage $E_{BB}$ varies in a negative direction, the base of transistor Q6 also varies in a negative direction but by an amount determined by the values of resistors 26 and 27. It is desirable that resistor 26 be larger than resistor 27 so that the base voltage of transistor Q6 varies by a smaller amount than the supply voltage $E_{BB}$; however, the relative values of these two resistors are also dependent upon the desired threshold setting for $V_0$ as previously mentioned. The emitter voltage of transistor Q6 follows the base voltage and draws the third circuit junction 24 to a more negative voltage level, thereby tending to offset the change in base potential of transistors Q4 and Q5.

Threshold drift due to temperature variation is minimized by the fabrication of transistors Q4, Q5 and Q6 in close proximity on a monolithic piece of semiconductor material, such as silicon. Since each transistor is part of the same piece of semiconductor material, a variation in temperature affects the base-emitter junction of each transistor in a like manner. If the temperature increases, the voltages across the base-emitter junctions of transistors Q4 and Q5 decrease tending to increase conduction of the transistors, or, in other words, tending to reduce the threshold. However, the voltage across the base-emitter junction of transistor Q6 also decreases tending to increase its conduction. The increased conduction of transistor Q6 results in a larger voltage drop across resistor 25 drawing the voltage level at the third circuit junction 24 more positive by substantially the same amount as the decrease in voltage across the base-emitter junctions of transistors Q4 and Q5. Consequently, level control circuit 4 not only sets the voltage level at junction 24 and modifies it whenever the supply voltage varies, but also maintains the voltage level relatively independent of temperature changes.

Although the input signal is illustrated as being bipolar, it is apparent to those skilled in the art that the input signal might be of one polarity only. Accordingly, the first stage of the sense amplifier need not be double ended at the input and/or output, but may be any amplifier which is suitable for a particular type of input signal. In the case of the first stage having a single ended output, the second stage may include only one input. Notwithstanding that the sense amplifier is illustrated as using NPN transistors, it is readily apparent that PNP transistors could be used along with appropriate changes in polarity of the bias voltages.

What is claimed is:

1. An electrical circuit comprising, a differential amplifier having first and second inputs, first and second outputs, and first and second power terminals, said first power terminal being coupled to a first circuit junction;

a current source having at least two terminals, one of said current source terminals being coupled to said second power terminal, the other of said current source terminals being coupled to a second circuit junction;

first, second and third transistors, each having base, collector and emitter electrodes, the emitter electrodes of each transistor being coupled to a third circuit junction, the collector electrodes of each transistor being coupled to said first circuit junction, said first and second amplifier outputs being coupled to the base electrodes of said first and second transistors respectively, and the emitter electrode of said third transistor being coupled by way of a first resistive means to said second circuit junction, the base electrode of said third transistor being coupled to said first circuit junction by a second resistive means and to said second circuit junction by a third resistive means, said third resistive means being large relative to said second resistive means.

2. The combination comprising first, second and third transistors each having base, emitter and collector electrodes, first means for coupling the collector electrodes of said first and second transistors in common and for coupling the emitter electrodes of said first, second and third transistors in common, input mean adapted to apply a first D.C. voltage to and difference mode signals between the base electrodes of said first and second transistors, a circuit arrangement adapted to apply operating voltage to the collector and emitter electrodes of each of said transistors, said arrangement including impedance means connected to said common emitter connection, and means for connecting the base electrode of said third transistor to a point of fixed potential such that said third transistor is normally biased on to provide current flow through said impedance means to thereby provide a D.C. reference voltage level at said common emitter connection.

3. The invention according to claim 2 wherein the values of said first and reference D.C. voltages are such that both said first and second transistors are off in the absence of said difference mode signals and one of said first and second transistors is on in the presence of said difference mode signals.

4. The invention according to claim 3 wherein said input means includes a differential amplifier.

5. The invention according to claim 4 wherein an output connection is coupled to the collector electrodes of said first and second transistors.

References Cited by the Examiner

UNITED STATES PATENTS 3,054,910 9/1962 Bothwell ---------- 307—88.5

ARTHUR GAUSS, *Primary Examiner.*

J. BUSCH, *Assistant Examiner.*